(12) United States Patent
Alles et al.

(10) Patent No.: US 8,728,873 B2
(45) Date of Patent: May 20, 2014

(54) METHODS FOR FILLING A CONTACT HOLE IN A CHIP PACKAGE ARRANGEMENT AND CHIP PACKAGE ARRANGEMENTS

(75) Inventors: Benjamin Alles, Munich (DE); Joachim Mahler, Regensburg (DE); Edward Fuergut, Dasing (DE); Ivan Nikitin, Regensburg (DE)

(73) Assignee: Infineon Technologies AG, Neubierg (DE)

( * ) Notice: Subject to any disclaimer, the term of this patent is extended or adjusted under 35 U.S.C. 154(b) by 1 day.

(21) Appl. No.: 12/879,069

(22) Filed: Sep. 10, 2010

(65) Prior Publication Data
US 2012/0061845 A1 Mar. 15, 2012

(51) Int. Cl.
*H01L 23/52* (2006.01)
*H01L 21/50* (2006.01)

(52) U.S. Cl.
USPC .................. 438/123; 438/106; 257/E23.141; 257/E21.499

(58) Field of Classification Search
None
See application file for complete search history.

(56) References Cited

U.S. PATENT DOCUMENTS

| | | | |
|---|---|---|---|
| 6,850,084 B2 * | 2/2005 | Hembree | 324/754.04 |
| 7,298,030 B2 * | 11/2007 | McWilliams et al. | 257/680 |
| 2005/0136639 A1 | 6/2005 | Davidson et al. | |
| 2007/0098883 A1 | 5/2007 | Itoh et al. | |

FOREIGN PATENT DOCUMENTS

| | | |
|---|---|---|
| EP | 1424731 A2 | 6/2004 |
| JP | 6252561 A | 9/1994 |
| JP | 11008454 A | 1/1999 |
| JP | 2003324126 A | 11/2003 |

OTHER PUBLICATIONS

English language abstract of JP 6252561 A.
English language abstract of JP 11008454 A.
English Abstract of JP 2003324126 A.

* cited by examiner

*Primary Examiner* — Seahvosh Nikmanesh

(57) ABSTRACT

In various embodiments, a method for filling a contact hole in a chip package arrangement is provided. The method may include introducing electrically conductive discrete particles into a contact hole of a chip package; and forming an electrical contact between the electrically conductive particles and a contact terminal of the front side and/or the back side of the chip.

18 Claims, 4 Drawing Sheets

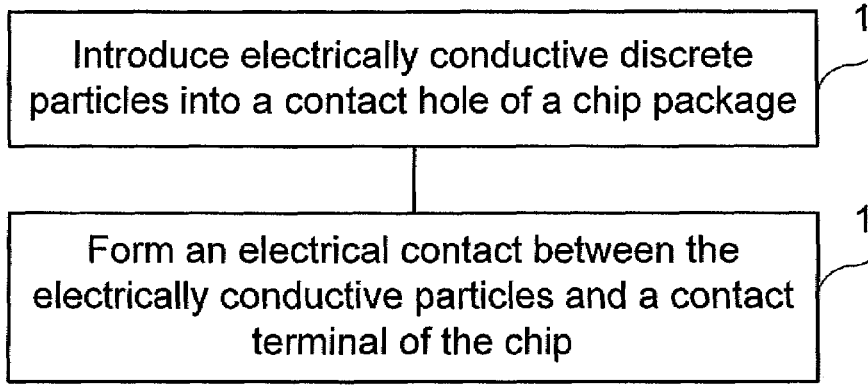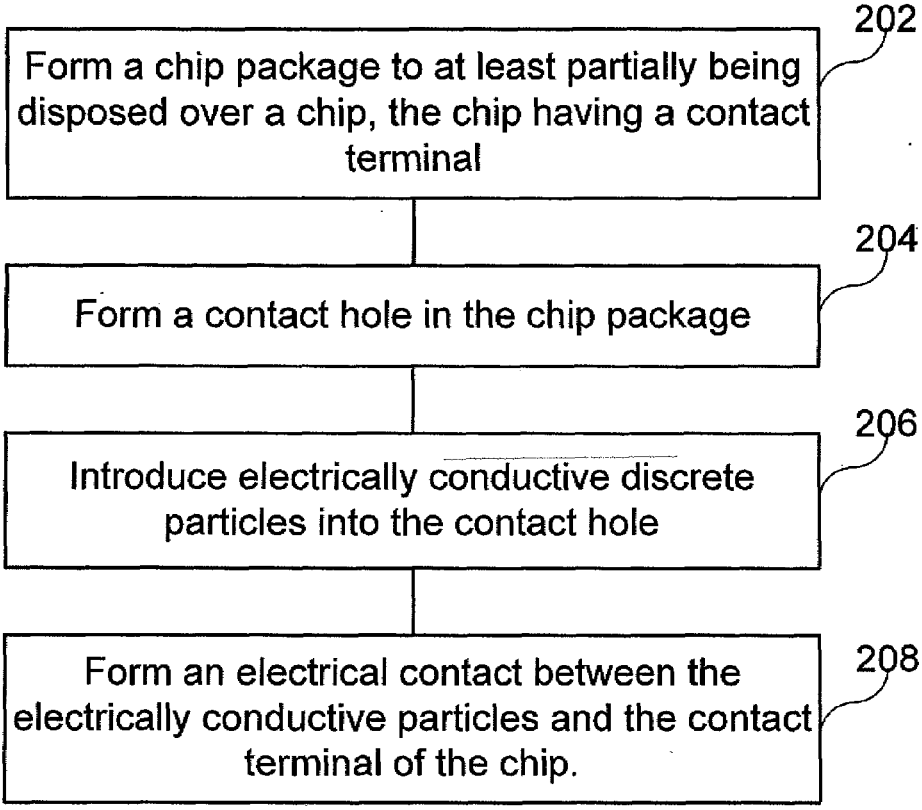

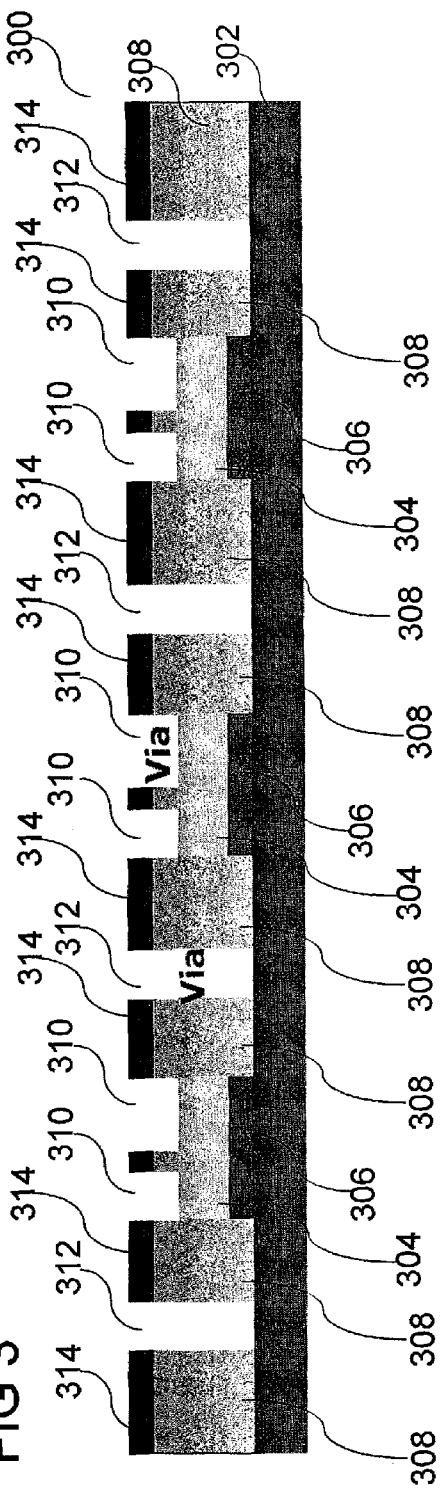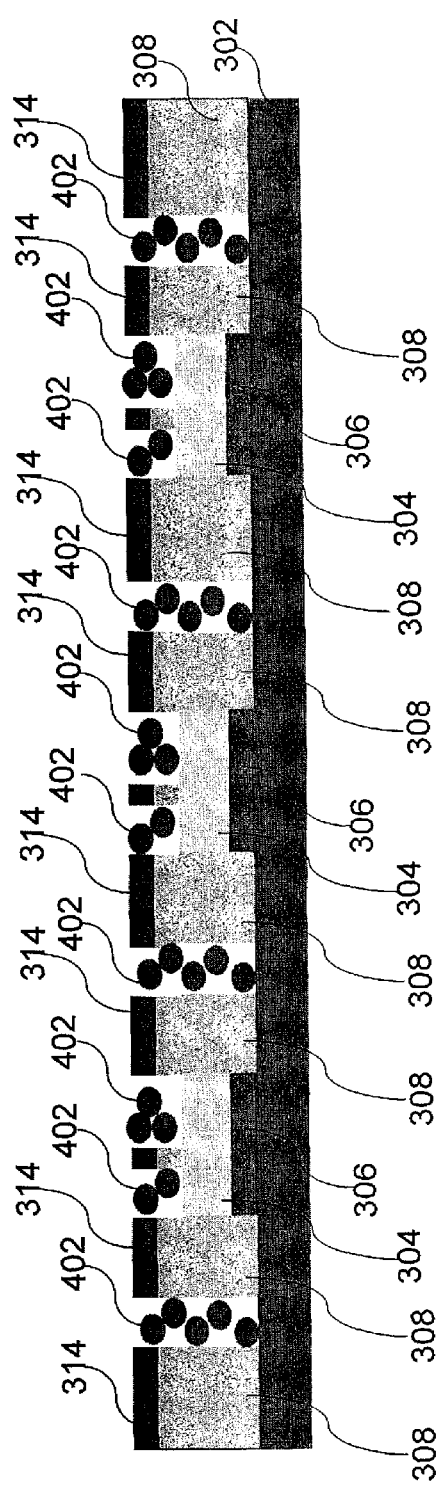

FIG 5
FIG 6

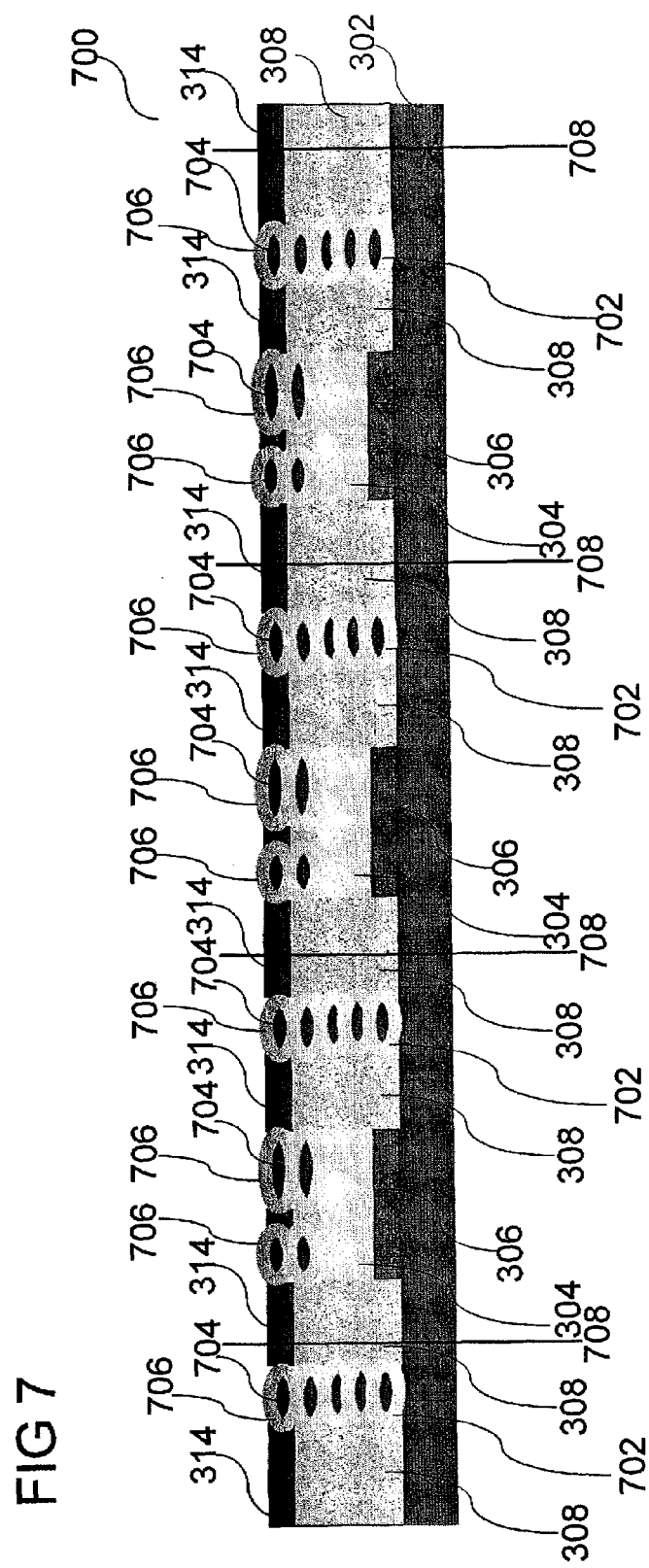

METHODS FOR FILLING A CONTACT HOLE IN A CHIP PACKAGE ARRANGEMENT AND CHIP PACKAGE ARRANGEMENTS

TECHNICAL FIELD

Various embodiments relate generally to methods for filling a contact hole in a chip package arrangement and chip package arrangements.

BACKGROUND

In chip packaging, the chips are usually enclosed by a chip package. In order to contact the chip from outside of the chip package, usually contact holes are provided in the chip package. The contact holes are usually filled with metal using a galvanic filling process, usually after a chemical activation of the contact holes. Using a galvanic filling process often results in rather large voids in the contact holes filled with metal and enforces limitations on the design. This may result in a substantial increase of the electrical and thermal resistance. Even more, the reliability of the chip package arrangement may suffer.

When using a metal stick for the filling of the contact hole, the bonding of the same within the contact holes may be a problem, since the interfaces created thereby may provide a lot of seeds for delamination. Furthermore, the metal stick would have to almost accurately fit into the contact hole.

SUMMARY

In various embodiments, a method for filling a contact hole in a chip package arrangement is provided. The method may include introducing electrically conductive discrete particles into a contact hole of a chip package; and forming an electrical contact between the electrically conductive particles and a contact terminal of the front side and/or the back side of the chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which:

FIG. 1 shows a flow diagram illustrating a method for filling a contact hole in a chip package arrangement in accordance with an embodiment;

FIG. 2 shows a flow diagram illustrating a method for forming a contact to a chip in a chip package arrangement in accordance with an embodiment;

FIG. 3 shows a plurality of chip package arrangements before singularization at a first stage of its manufacture in accordance with an embodiment;

FIG. 4 shows a plurality of chip package arrangements before singularization at a second stage of its manufacture in accordance with an embodiment;

FIG. 5 shows a plurality of chip package arrangements before singularization at a third stage of its manufacture in accordance with an embodiment;

FIG. 6 shows a plurality of chip package arrangements before singularization at a second stage of its manufacture in accordance with another embodiment; and FIG. 7 shows a plurality of chip package arrangements before singularization at a second stage of its manufacture in accordance with yet another embodiment.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

In the claims and in the following description different embodiments of a method for filling a contact hole and for forming a contact are described as a particular sequence of processes or measures, e.g. in the flow diagrams. It is to be noted that the embodiments should not be limited to the particular sequence described. Particular ones or all of different processes or measures can also be conducted simultaneously or in any other useful and appropriate sequence.

In various embodiments, the use is made of electrically conductive discrete particles (e.g. microparticles) for filling contact holes in a chip package in the back-end-of-line processing of a chip or of a plurality of chips. The electrically conductive discrete particles are used for making (direct or indirect) electrical contact with the chip, e.g. via a chip contact terminal. The method may include a plurality of process stages, e.g. the additional galvanic filling of the contact hole(s) which are pre-filled with the particles, or the partial melting or sintering or curing of the particles filled into the contact hole(s). In various embodiments, the same or different particles (made of the same material or made of different materials) may be used to reduce the voids in a chip package contact hole.

The various embodiments may use various types of a chip, e.g. semiconductor chips or semiconductor substrates, among them logic integrated circuits, analog integrated circuits, mixed signal integrated circuits, sensor circuits, MEMS (Micro-Electro-Mechanical Systems), power integrated circuits, chips with integrated passives, discrete passives and so on. In general, the term "semiconductor chip" as used in this application can have different meanings one of which is a semiconductor die or semiconductor substrate including an electrical circuit.

In various embodiments, a chip may include a plurality of chips which may together be located in one single chip package arrangement and being packaged together, even after the singularization of a wafer in case a plurality of package arrangements are formed simultaneously. The chips may be located next to each other and/or may be stacked one above the other to form multichip packages in the chip package arrangement (in which case the electrical contacts in accordance with various embodiments may be provided between two respective chips of the multichip package and are provided for an electrical connection between the two respective chips; thus, illustratively, the electrical contacts in accordance with various embodiments may be provided in a chip-to-chip interconnection in a multichip package). Furthermore, in various embodiments, the chip or the chips may be carried by a chip carrier such as e.g. a leadframe.

In several embodiments layers are applied to one another or materials are applied or deposited onto layers. It should be appreciated that any such terms as "applied" or "deposited" are meant to cover literally all kinds and techniques of applying layer onto each other. In one embodiment, they are meant to cover techniques in which layers are applied at once as a whole, like, for example, laminating techniques, as well as techniques in which layers are deposited in a sequential manner, like, for example, sputtering, plating, molding, chemical vapor deposition (CVD) and so on.

The semiconductor chips may include contact elements (also referred to as contact terminals in the following) or contact pads on one or more of their outer surfaces wherein the contact elements serve for electrically contacting the (semiconductor) chips. The contact elements may be made from any electrically conducting material, e.g., from a metal as aluminum, gold, or copper, for example, or a metal alloy, e.g., solder alloy, or an electrically conducting organic material, or an electrically conducting semiconductor material.

FIG. 1 shows a flow diagram 100 illustrating a method for filling a contact hole in a chip package arrangement in accordance with an embodiment. The method may include, in 102, introducing electrically conductive discrete particles into a contact hole of a chip package, and, in 104, forming an electrical contact between the electrically conductive particles and a contact terminal of the front side and/or the back side of the chip.

The term "electrically conductive discrete particles" may be understood in various embodiments as any kind of separate small pieces of generally any kind of material. The size of the particles may be in the micrometer or nanometer range. In various embodiments, the diameter of the electrically conductive discrete particles is in the range from about 1 nm to about 50 μm, e.g. in the range from about 5 nm to about 3 μm. The particles may be of any shape, e.g. ball shape, polygonal (regular or irregular) shape, rod shape, and the like. It should be mentioned that the shape of the particles does not have to be the same for all particles. By way of example, in case the particles are of an approximate ball shape, the diameter of the balls may be in the range from about 5 nm to about 3 μm, e.g. in the range from about 10 nm to about 2 μm, e.g. in the range from about 50 nm to about 500 nm, e.g. in the range from about 100 nm to about 200 nm. The particles may be made from electrically conductive material such as e.g. a metal (e.g. copper and/or silver) or an intrinsic conductive polymer (ICP), or from semiconducting material or even electrically insulating material, e.g. ceramic. To provide the electrical conductivity, the particles may be coated with electrically conductive material, e.g. with a metal (e.g. copper and/or silver) or an intrinsic conductive polymer. In various embodiments, the electrically conductive discrete particles are electrically conductive discrete microparticles or nanoparticles. In various embodiments, an intrinsic conductive polymer (ICP) may be understood as being a polymer that conducts electric currents without the addition of conductive (inorganic) substances. Examples of intrinsic conductive polymers that may be used in various embodiments are polyaniline (PAni), polypyrrole (PPY), polyethylenedioxythiophene (PEDOT), polythiophene.

The method may in various embodiments further include forming one or more metalization layer(s) on the upper surface of the chip package such that the metalization layer is in electrical contact with the electrically conductive discrete particles in the contact hole to thereby form an electrical contact between the metalization layer and the contact terminal of the front side and/or the back side of the chip via the electrically conductive discrete particles.

In order to form the electrical contact, in various embodiments, the electrically conductive particles may be partially melted (e.g. to provide a reflow of some outer region material of the particles) in such a manner to substantially completely fill the contact hole.

Moreover, in various embodiments, the method may further include, after introducing the electrically conductive discrete particles into the contact hole of the chip package, galvanically filling the contact hole. This may ensure a filling with reduced voids and thus an increased conductivity of the contact hole filling. Furthermore, it may be provided that the contact hole may be chemically activated in an as such known manner before the galvanic filling is carried out.

In various embodiments, the diameter/radius of the contact hole of any shape may be in the range from about 1 μm to about 500 μm, e.g. in the range from about 25 μm to about 200 μm, e.g. in the range from about 50 μm to about 100 μm.

Furthermore, in various embodiments, the chip package arrangement may include a plurality or a multiplicity of contact holes in the chip package. The contact holes may have the same or different depths. By way of example, as will be described in more detail below, one or more contact holes may be provided to directly contact one or more respective contact terminals provided on the front side of the chip and one or more contact holes may be provided to directly contact an electrically conductive structure external to the chip to be contacted, such as an electrically conductive portion of the chip carrier, e.g. of a leadframe, thereby indirectly (e.g. via the electrically conductive structure) electrically contacting one or more respective contact terminals, which may be e.g. provided on the rear side of the chip.

In various embodiments, the method may further include forming a chip carrier, e.g. a lead frame, forming a chip package above the lead frame, forming the contact hole in the chip package such that the contact hole exposes at least a portion of the chip carrier.

FIG. 2 shows a flow diagram 200 illustrating a method for forming a contact to a chip in a chip package arrangement in accordance with an embodiment. The method may include, in 202, forming a chip package to at least partially being disposed over a chip, the chip including a contact terminal. The method may further include, in 204, forming a contact hole in the chip package, and, in 206, introducing electrically conductive discrete particles into the contact hole. The method may further include, in 208, forming an electrical contact between the electrically conductive particles and the contact terminal of the front side and/or the back side of the chip.

In various embodiments, the method may further include forming a metalization layer on the upper surface of the chip package such that the metalization layer is in electrical contact with the electrically conductive discrete particles in the contact hole to thereby form an electrical contact between the metalization layer and the contact terminal of the front side and/or the back side of the chip via the electrically conductive discrete particles.

In order to form the electrical contact, in various embodiments, the electrically conductive particles may be partially melted (e.g. to provide a reflow of some outer region material of the particles) in such a manner to substantially completely fill the contact hole.

In addition, in various embodiments, the method may further include, after introducing the electrically conductive discrete particles into the contact hole of the chip package, galvanically filling the contact hole. This may ensure a filling with reduced voids and thus an increased conductivity of the contact hole filling. Furthermore, it may be provided that the contact hole may be chemically activated in an as such known manner before the galvanic filling is carried out.

In various embodiments, the diameter/radius of the contact hole of any shape may be in the range from about 1 μm to about 500 μm, e.g. in the range from about 25 μm to about 200 μm, e.g. in the range from about 50 μm to about 100 μm.

Furthermore, in various embodiments, the chip package arrangement may include a plurality or a multiplicity of contact holes in the chip package. The contact holes may have the same or different depths. By way of example, as will be described in more detail below, one or more contact holes may be provided to directly contact one or more respective contact terminals provided on the front side or back side of the chip and one or more contact holes may be provided to directly contact an electrically conductive structure external to the chip to be contacted, such as an electrically conductive portion of the chip carrier, e.g. of a leadframe, thereby indirectly (e.g. via the electrically conductive structure) electrically contacting one or more respective contact terminals, which may e.g. be provided on the rear side of the chip.

In various embodiments, the method may further include forming a chip carrier, e.g. a lead frame, forming a chip package above the lead frame, forming the contact hole in the chip package such that the contact hole exposes at least a portion of the chip carrier.

FIG. 3 shows a plurality of examples of chip package arrangements in a first diagram 300 before singularization at a first stage of its manufacture in accordance with an embodiment.

As shown in FIG. 3, the plurality of chip package arrangements may include a chip carrier 302 such as e.g. a leadframe, which may include or be made of a metal such as copper. In various embodiments, the chip carrier may be implemented as a plate, e.g. made of or including metal such as e.g. copper. Furthermore, a plurality of chips 304, such as those as described above, may be placed on the chip carrier 302 and may e.g. be fixed, e.g. adhered, to the chip carrier 302, e.g. by means of a fixing structure 306 such as an adhesive 306 (which may be electrically conductive or electrically non-conductive (e.g. in case there is no direct electrical connection between the chip and the chip carrier 302 necessary) or by means of solder paste 306. In case the chip 304 is e.g. provided with one or more rear side contacts (such as e.g. a rear side metalization), the fixing structure 306 may provide an electrical conductive path between the rear side contact(s) of the chip 304 and the chip carrier 302. In various embodiments, the chips 304 may have a chip thickness in the range from about 40 μm to about 80 μm, e.g. a chip thickness in the range from about 50 μm to about 70 μm, e.g. a chip thickness of about 60 μm.

Moreover, in various embodiments, a chip package 308 (e.g. made of a chip package material, in the following also referred to as encapsulating material) may at least partially be disposed over each chip 304. In various embodiments, the chip package 308 may include or be formed as a laminate. In various embodiments, the chip package 308 may be formed on or over the top surface and/or the side surfaces of each chip 304. Thus, in various embodiments, the chips 304 may at least partially be enclosed by the chip package 308. In some embodiments, the (semiconductor) chips 304 may be covered with an encapsulant material. The encapsulant material may include any electrically insulating material like, for example, any kind of molding material, any kind of epoxy material, or any kind of resin material with or without any kind of filler materials. In special cases it could be provided to use a conductive encapsulant material. In various embodiments, the encapsulant material may include glass fibres to strengthen the encapsulant material. In various embodiments, the chip package 308 may form a layer over the chip carrier 302 and the chips 304. In various embodiments, the chip package 308 may have a layer thickness in the range from about 50 μm to about 200 μm, e.g. a layer thickness in the range from about 75 μm to about 150 μm, e.g. a layer thickness of about 100 μm.

Furthermore, in various embodiments, each chip package arrangement to be formed may include a plurality of contact holes 310, 312 formed in the chip package 308, wherein a plurality of first contact holes 310 may be arranged such that they expose front side contact terminals (e.g. chip pads) of the chip 304. Furthermore, a plurality of second contact holes 312 may be arranged such that they expose a portion of the chip carrier 302, to thereby e.g. indirectly contact e.g. the rear side contact terminals (e.g. chip pads) of the chip 304. As shown in FIG. 3, the first contact holes 310 may have a first depth considered from the upper surface of the chip package 308 and extending down to the upper surface of the chip(s) 304. Furthermore, the second contact holes 312 may have a second depth considered from the upper surface of the chip package 308 and extending down to the upper surface of the chip carrier 302. The second depth may be larger than the first depth. Thus, in various embodiments, it is possible to easily fill contact holes with different depths. In various embodiments, the first depth may be in the range from about 20 μm to about 60 μm, e.g. a layer thickness in the range from about 30 μm to about 50 μm, e.g. a layer thickness of about 40 μm. In various embodiments, the second depth may be in the range from about 50 μm to about 500 μm, e.g. a layer thickness in the range from about 75 μm to about 150 μm, e.g. a layer thickness of about 100 μm.

In various embodiments, the first contact holes 310 and/or the second contact holes 312 may have a diameter in the range from about 1 μm to about 200 μm (e.g. in case the chips 304 are implemented as logic chips 304). In various embodiments, the first contact holes 310 and/or the second contact holes 312 may have a diameter in the range from about 25 μm to about 200 μm (e.g. in case the chips 304 are implemented as power semiconductor chips 304).

The contact holes 310, 312 may be formed in various embodiments in various ways such as e.g. by means of drilling, lasering, or milling, as desired. Other ways of forming the contact holes 310, 312 may be provided in alternative embodiments.

In various embodiments, the chip 304 may be provided as a power semiconductor chip having three contact terminals (e.g. a drain terminal, a source terminal and a gate terminal for a power (e.g. MOS) field effect transistor; or e.g. an emitter terminal, a collector terminal and a base terminal for a power bipolar transistor). However, two or even more than three contact terminals may be provided for a chip in accordance with alternative embodiments. In various embodiments, the number of contact holes may correspond to the number of contact terminals to be individually contacted. Moreover, in various embodiments, one or more of the contact terminals may include a plurality of respectively separate partial contact terminals. The partial contact terminals may be considered as wire arrays. This may result in a more reliable connection.

Additionally, in various embodiments, a metalization layer 314 (e.g. made of electrically conductive material such as e.g. a metal, e.g. copper), which may be patterned in a predefined manner, may be provided on or above the upper surface of the chip package 308. The metalization layer 314 may be provided having a layer thickness in the range from about 5 μm to about 40 μm, e.g. a layer thickness in the range from about 5 μm to about 20 μm.

FIG. 4 shows a plurality of examples of chip package arrangements in a second diagram 400 before singularization at a second stage of its manufacture in accordance with an embodiment.

As shown in FIG. 4, electrically conductive discrete particles 402, such as those as described above, may be introduced into the contact holes 310, 312. As described above, the electrically conductive discrete particles 402 may be electrically conductive discrete balls 402, which may have a diameter e.g. of a few micrometers down to a few nanometers.

Figures 5, 6:
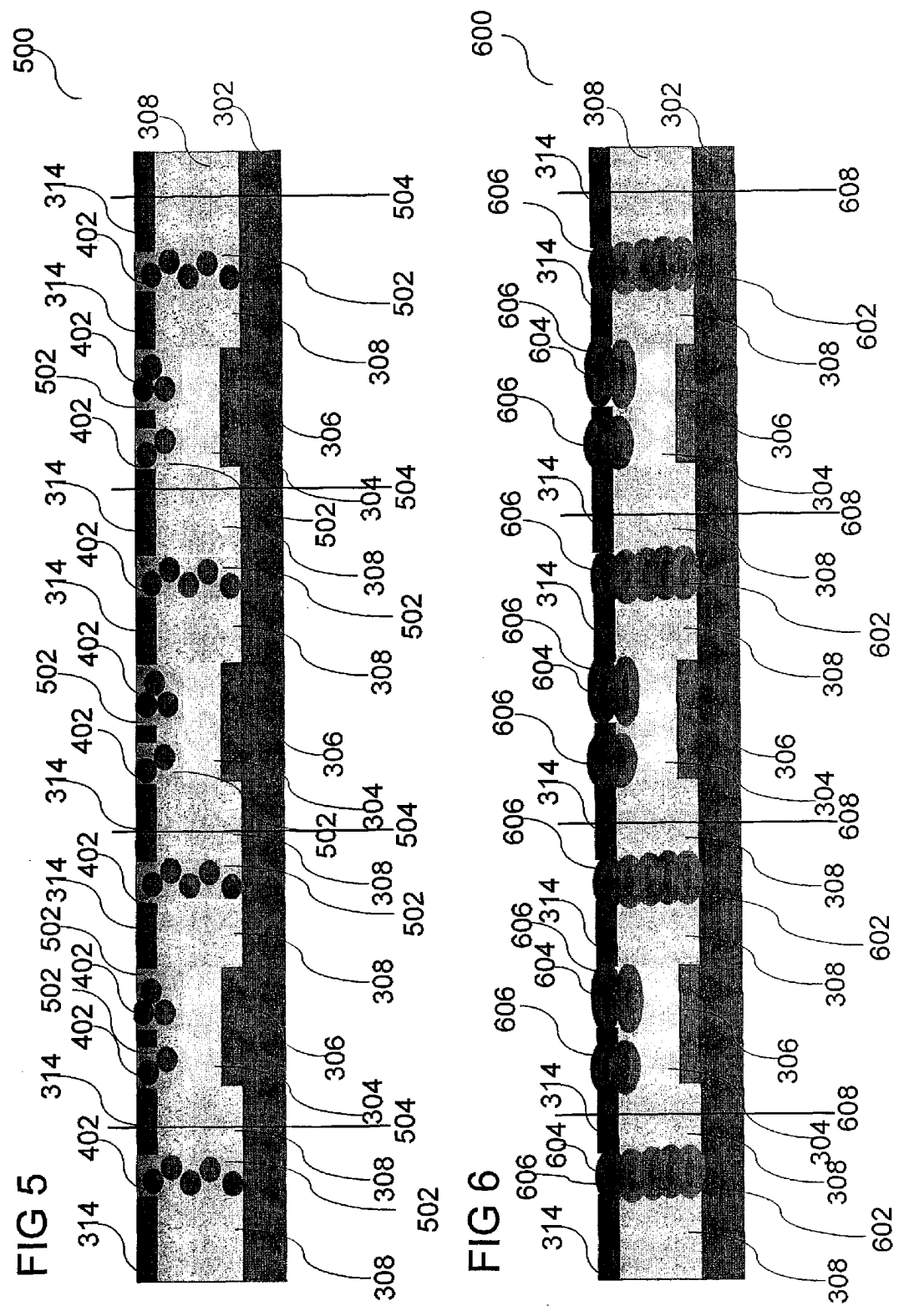

FIG. 5 shows a plurality of examples of chip package arrangements in a third diagram 500 before singularization at a third stage of its manufacture in accordance with an embodiment.

Then, in various embodiments, as shown in FIG. 5, the contact holes 310, 312 may be completely filled galvanically, e.g. after a chemical activation of the contact holes 310, 312, thereby forming a galvanic rest filling 502.

FIG. 6 shows a plurality of examples of chip package arrangements in a second diagram 600 before singularization at a second stage of its manufacture in accordance with another embodiment.

In these embodiments, it may be provided to use electrically conductive discrete particles 602, wherein at least some of the electrically conductive discrete particles 602 may respectively include a particle core 604 and a particle coating 606 covering at least partially or completely the surface of the particle core 604. The particle core 604 may be made of or include electrically conductive material and/or electrically non-conductive material such as ceramic. The particle coating 606 may be made of or may include electrically conductive material. In various embodiments, the particle coating 606 may be made of or may include intrinsic conductive polymer (ICP). In these embodiments, it may be provided that electrical contacts between the electrically conductive discrete particles 602 on the one hand and the contact hole walls and the bottom of the contact holes 310, 312, on the other hand, may be formed due to the elastic deformation of the polymer particle coating 606. Thus, in these embodiments, an additional galvanic (rest) filling of the contact holes 310, 312 may be completely dispensed with. Furthermore, these embodiments may provide an increased decoupling between the electrically conductive material (e.g. metal) of the chip carrier 302 and the chip package 308 via the contact hole filling due to the use of a soft (e.g. elastic) particle coating 606 such as a polymer based particle coating 606.

In various embodiments, after the electrically conductive discrete particles 602 have been filled into the contact holes 310, 312, the polymer based particle coating 606 may be melted and cooled down again, thereby forming an adhesion bonding between the contact hole walls and the bottom of the contact holes 310, 312, on the other hand, and the electrically conductive discrete particles 602 on the other hand.

In various embodiments, as an alternative to the pure metallic filler balls, e.g. metallized ceramic particles or ceramic particles coated with intrinsic conductive polymer (ICP) may be used. These embodiments may provide the effect that the difference of the coefficients of thermal expansion (CTE) between the CTE of the metallized ceramic particles or ceramic particles coated with intrinsic conductive polymer (ICP) on the one hand and the material of the chip (e.g. silicon (Si)) on the other hand may be rather small. This may result in a substantial improvement of the reliability of the chip package arrangement in accordance with various embodiments.

FIG. 7 shows a plurality of examples of chip package arrangements in a second diagram 700 before singularization at a second stage of its manufacture in accordance with yet another embodiment.

In these embodiments, it may be provided to use electrically conductive discrete particles 702, wherein at least some of the electrically conductive discrete particles 702 may respectively include a particle core 704 and a particle coating 706 covering at least partially or completely the surface of the particle core 704. The particle core 704 may be made of or may include electrically conductive material such as e.g. a first metal or a first metal system. The particle coating 706 may be made of or may include electrically conductive material such as e.g. a second metal or a second metal system. In various embodiments, the first metal or first metal system may include copper (Cu). Furthermore, in various embodiments, the second metal or second metal system may include tin (Sn).

In various embodiments, after the electrically conductive discrete particles 702 have been filled into the contact holes 310, 312, an anneal process at a temperature of about 231° C. or more may be carried out, which may e.g. be implemented locally by using one or more lasers. In the anneal process, the particle coating 706, e.g. the second metal or second metal system may be melted, thereby e.g. forming (at least partially) a thermodynamically stable $CuSn_3$ with the intermediate thermodynamically unstable $Cu_6Sn_5$ also being formed. The thermodynamically stable $CuSn_3$ has a melting point of above 600° C.

In various embodiments, as an alternative to the pure metallic filler balls, e.g. metallized ceramic particles or ceramic particles coated with intrinsic conductive polymer (ICP) may be used. These embodiments may provide the effect that the difference of the coefficients of thermal expansion (CTE) between the CTE of the metallized ceramic particles or ceramic particles coated with intrinsic conductive polymer (ICP) on the one hand and the material of the chip (e.g. silicon (Si)) on the other hand may be rather small. This may result in a substantial improvement of the reliability of the chip package arrangement in accordance with various embodiments.

In various embodiments, (elastic) (e.g. non-conductive) polymer particles (e.g. approximately 5 to 20 volume % of the total ball volume) to the electrically conductive discrete particles, material to compensate or cure breaks or cracks in the filling may be introduced in a targeted manner. This may result in an increase of the reliability of the chip package arrangement. This may illustratively be understood as an analog of e.g. so-called coated polymer core balls (SOL balls) in solder balls of a ball grid array (BGA).

In various embodiments, as e.g. in the embodiments described above, a parallel, i.e. simultaneous packaging for a plurality or multiplicity of chips, which may all be carried by one single chip carrier, may be provided, followed by a singularization of the chip package arrangements at the end of the packaging process.

In various embodiments, it may be provided to use particles of different materials for the filling of different holes in the packaging process. This may enable even a parallel or simultaneous packaging of different types of chips, e.g. logic chips together with semiconductor power chips or memory chips, and the like.

In various embodiments, after the contact holes 310, 312 are filled and contacted, the respective chip package arrangements are singulated (e.g. by means of sawing, breaking, by chemical means, by laser, by exposure to plasma or in any other suitable manner), e.g. along cutting lines 504, 608, 708, as indicated in FIGS. 5, 6, and 7.

In various embodiments, the contact holes or vias may be filled in a manner to realize electric contacts by means of a two-stage process, in order to avoid larger voids in the contact hole or via metalization:

In a first stage of the process, particles such as e.g. balls (e.g. metal balls), which may have a diameter e.g. of a few micrometers down to a few nanometers, may be inserted or introduces into the contact holes or vias to be filled.

In a second stage of the process, the contact holes or vias may then completely be filled galvanically, e.g. after a chemical activation.

In various embodiments, it may be provided that a mixture of different particles such as particles as described above, e.g. metallic microparticles on the basis of copper or silver, are introduced into the contact holes (also referred to as contact vias) and are subsequently annealed or tempered such that the contact holes are (completely) filled. In various embodiments, the annealing or tempering may be provided in a localized manner e.g. by means of one or more lasers, or by means of plasma irradiation.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for filling a contact hole in a chip package arrangement, the method comprising:
    attaching a chip including a contact terminal to a chip carrier;
    at least partially encapsulating the chip with an encapsulation mold compound;
    introducing electrically conductive discrete particles into a contact hole of a chip package; and
    forming an electrical contact between the electrically conductive particles and a contact terminal of at least one of a front side and a back side of a chip that is attached to the chip carrier.

2. The method of claim 1,
wherein the electrically conductive discrete particles are coated with electrically conductive material.

3. The method of claim 1,
wherein the electrically conductive discrete particles are coated with at least one of a metal and an intrinsic conductive polymer material.

4. The method of claim 1,
wherein the electrically conductive discrete particles are metal particles.

5. The method of claim 1,
wherein the diameter of the electrically conductive discrete particles is in the range from about 1 nm to about 50 μm.

6. The method of claim 1, further comprising:
forming a metalization layer on the upper surface of the chip package such that the metalization layer is in electrical contact with the electrically conductive discrete particles in the contact hole to thereby form an electrical contact between the metalization layer and the contact terminal of at least one of the front side and the back side of the chip via the electrically conductive discrete particles.

7. The method of claim 1, further comprising:
partially melting or sintering or curing the electrically conductive particles in such a manner to substantially completely fill the contact hole.

8. The method of claim 1, further comprising:
after introducing the electrically conductive discrete particles into the contact hole of the chip package, galvanically filling the contact hole.

9. The method of claim 1,
wherein the diameter/radius of the contact hole is in the range from about 1 μm to about 500 μm.

10. The method of claim 1,
wherein the contact hole comprises a plurality of contact holes.

11. The method of claim 10,
wherein at least some of the contact holes of the plurality of contact holes have different depths.

12. The method of claim 1, further comprising:
forming a chip package above a lead frame;
forming the contact hole in the chip package such that the contact hole exposes at least a portion of the chip carrier.

13. A method for forming a contact to a chip in a chip package arrangement, the method comprising:
    attaching a chip including a contact terminal to a chip carrier;
    forming a chip package to be at least partially disposed over the chip, the chip package comprising an encapsulation mold compound;
    forming a contact hole in the chip package;
    introducing electrically conductive discrete particles into the contact hole; and
    forming an electrical contact between the electrically conductive particles and the contact terminal of at least one of a front side and a back side of the chip.

14. The method of claim 13, further comprising:
partially melting or sintering or curing the electrically conductive particles in such a manner to substantially completely fill the contact hole.

15. The method of claim 13, further comprising:
after introducing the electrically conductive discrete particles into the contact hole of the chip package, galvanically filling the contact hole.

16. The method of claim 15, further comprising:
before galvanically filling the contact hole, chemically activating the electrically conductive discrete particles in the contact hole,
wherein electroplating is used to galvanically fill the contact hole.

17. The method of claim 13,
wherein the diameter/radius of the contact hole is in the range from about 1 μm to about 500 μm.

18. The method of claim 13, further comprising:
forming an electrical contact between the electrically conductive particles and a contact terminal of another chip provided in the chip package.

* * * * *